United States Patent
Goenka et al.

(10) Patent No.: US 6,395,994 B1
(45) Date of Patent: May 28, 2002

(54) ETCHED TRI-METAL WITH INTEGRATED WIRE TRACES FOR WIRE BONDING

(75) Inventors: Lakhi Nandial Goenka, Ann Arbor; Mohan R. Paruchuri, Canton, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/495,242

(22) Filed: Jan. 31, 2000

(51) Int. Cl.[7] .................................................. H05K 1/03
(52) U.S. Cl. ...................................................... 174/255
(58) Field of Search ................................. 361/760, 767, 361/772, 723, 724, 777, 803, 807, 748–749, 750–751; 174/268, 254; 29/854, 832, 840; 428/209, 901; 257/750, 736; 439/77, 67

(56) References Cited

U.S. PATENT DOCUMENTS

| | | | |
|---|---|---|---|
| 3,801,388 A | | 4/1974 | Akiyama et al. ............... 156/3 |
| 4,404,059 A | | 9/1983 | Livshits et al. .............. 156/629 |
| 4,676,867 A | * | 6/1987 | Elkins et al. ................ 257/750 |
| 5,016,089 A | * | 5/1991 | Fujii et al. ................... 361/772 |
| 5,198,885 A | * | 3/1993 | Ibrahim ....................... 361/394 |
| 5,656,830 A | * | 8/1997 | Zechman .................... 257/784 |
| 5,738,797 A | | 4/1998 | Belke, Jr. et al. ............. 216/16 |
| 6,208,521 B1 | * | 3/2001 | Nakatsuka .................. 361/749 |

* cited by examiner

Primary Examiner—Brian Sircus
Assistant Examiner—Phuong KT Dinh
(74) Attorney, Agent, or Firm—MacMillan, Sobanski & Todd, LLC

(57) ABSTRACT

A circuit component secured to a printed circuit board typically uses fine wires for completing the circuit from the printed circuit to the component. The component may be an integrated circuit having one or more pads thereon for receiving the wire. A device and method for making the device has the printed circuit formed on the PCB with one or more wire traces that are etched away from the printed circuit. The etchant removes a portion of the bottom layer and sometimes the middle layer of an etched tri-metal along with any lamination and adhesive. This forms a free end of the wire trace that is bonded to the component. Additional wires are not required.

18 Claims, 1 Drawing Sheet

ETCHED TRI-METAL WITH INTEGRATED WIRE TRACES FOR WIRE BONDING

BACKGROUND OF THE INVENTION

1. Field of the Invention

This invention relates generally to Etched Tri-Metal "ETM" electronic circuit assemblies and more particularly to wire traces on the circuit board for bonding to the component attached to the board.

2. Description of the Related Art

In the field of electronics manufacturing, various additive and subtractive processes are known for constructing printed circuit boards (PCBs). Among these is the process disclosed in U.S. Pat. No. 3,801,388 issued on Apr. 2, 1974 to Akiyama et al. which is a subtractive process. The process disclosed in U.S. Pat. No. 4,404,059 issued on Sep. 13, 1983 to Livshits et al is an additive process. The process disclosed in U.S. Pat. No. 5,738,797 issued on Apr. 14, 1998 to Belke, Jr. et al that is assigned to a common assignee is also a subtractive process. All three of these patents are incorporated herein by reference. These patents describe various additive and subtractive plating and chemical etching processes for constructing multi-layer PCBs having air bridges.

Currently tri-metallic materials, as used in the manufacture of PCBs, are a sandwich with aluminum as the middle layer and copper as the top and bottom layers. The layers are typically bonded together with a zinc-bonding layer The air bridge structures disclosed in these patents are useful in offering design flexibility and printed circuit board real estate savings as far as routing and layout of circuit traces. However, these patents do not discuss using wire structures to make interconnects with wire-bonding techniques. In addition, these patents do not discuss creating composite copper-aluminum wires.

SUMMARY OF THE INVENTION

It is a principal advantage to provide integrated wire traces which can be used to obtain electrical connections to internal input-output, "I/O" devices.

It is yet another advantage to avoid the use of external wires on a PCB when wiring an electrical device to the circuit of the PCB.

Still another advantage is the elimination of bond pads on the circuit of the PCB.

It is still a further advantage to either use a copper wire trace or a composite copper-aluminum wire trace on the PCB.

These and other advantages are found in an etched tri-metal printed circuit board having integrated wire traces for wire bonding integrated circuit devices to the board. The board has a substrate layer for supporting the etched tri-metal material. An etched tri-metal layer has a top, middle and bottom layer, with the bottom layer bonded to the substrate. A circuit pattern is etched in one or more layers of the tri-metal layer, with the pattern having at least one area adapted to expose the surface of at least the middle layer for forming a pocket in the tri-metal layer. The depth of the pocket can extend to the substrate.

A circuit device located in the one area and secured to the exposed surface be it one of the layers of the tri-metal or the substrate. At least one wire trace having at least one of the tri-metal layers is integral with the top layer extending from an adjacent surface to the pocket with a free end of the wire trace extending over a portion of the device and bonded to the device.

In addition, other advantages can be found in a method for forming an etched tri-metal printed circuit board with integrated wire traces for wire bonding integrated circuit devices to the board. The method begins with the step of locating a substrate layer. An etched tri-metal layer having a top, middle and bottom layer is located on the substrate layer. The bottom layer of the etched tri-metal is bonded to the substrate layer.

Next a circuit pattern is etched in or on one or more layers of the tri-metal layer. The pattern has at least one area adapted to expose the surface of at least the middle layer for forming a pocket in the tri-metal layer. A circuit device is located in the one area and the circuit device is bonded to the exposed surface.

At least one wire trace is formed having at least one of the tri-metal layers integral with the top layer from which it is formed. The wire trace extends from an adjacent surface to the pocket with a free end of the wire trace extending over a portion of the device. The wire trace is then bonded to the device.

These and other advantages are to be found in the following detailed description and drawings.

DETAILED DESCRIPTION OF THE PREFERRED EMBODIMENT

Figure 1:
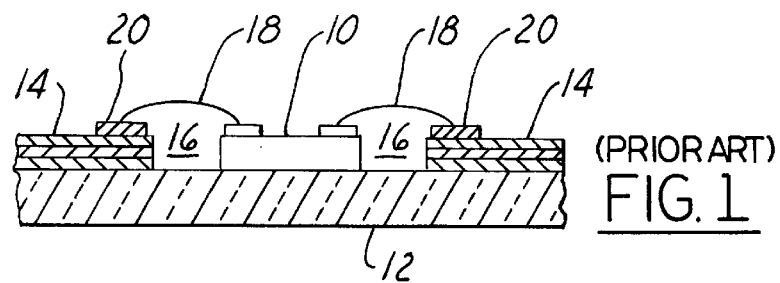
FIG. 1 is an elevation view of the prior art bonding of a device on a PCB.

Referring to the Figs by the characters of reference there is illustrated in FIG. 1 a prior art method of electrically connecting a device 10 to a printed circuit board, PCB. Mounted and secured to a substrate 12 is a circuit layout formed in tri-metal material 14 that may be an etched tri-metal pattern. In the middle of the Fig., the tri-metal material 14 is removed 16 or etched away for allowing the device 10 to be mounted directly on the surface of the substrate 12. Typically thin wires or whiskers 18 are soldered from a mounting pad 20 on the circuit layout 14 to a mounting pad 22 on the device 10. If the electrical characteristics of the circuit are such, the wires or whiskers may be much thicker in this view.

Such wire bonding requires the use of fine aluminum wire 18, as well as suitable bonding pads 20, 22 onto which the wire is bonded. This is added cost both in material, labor and process steps.

FIGS. 2–6 illustrate an etched tri-metal printed circuit board 30 with integrated wire traces 32, 34 for wire bonding integrated circuit devices 36 to the board according to the present invention. A substrate layer 38 forms the core of the PCB 30 has an etched tri-metal layer 40 mounted thereon by means of an adhesive 42. The etched tri-metal layer 40 material has a top 44, middle 46 and bottom 48 layer, with the bottom 48 layer being bonded by the adhesive 42 to the substrate layer 38. Typically the top 44 and bottom 48 layers are copper and the middle 46 layer is aluminum.

A circuit pattern is etched in one or more layers 44, 46, 48 of the tri-metal layer 40. The pattern, the plan view of which is not shown, is typically formed by means of either the additive process as disclosed in U.S. pat. No. 4,404,059 to Livshits et al. or the subtractive process as shown in U.S. pat. No. 3,801,388 issued to Akiyama et al. or U.S. Pat. No. 5,738,797 issued to Belke, Jr. et al. All of these patents are identified in the Description of the Prior Art and are incorporated herein by reference. The pattern typically has at least one area adapted to expose the surface of at least the middle layer for forming a pocket 50 in the tri-metal layer 40. In the Figs, the pocket 50 extends down to the upper bottom 48 layer surface.

Figure 2:
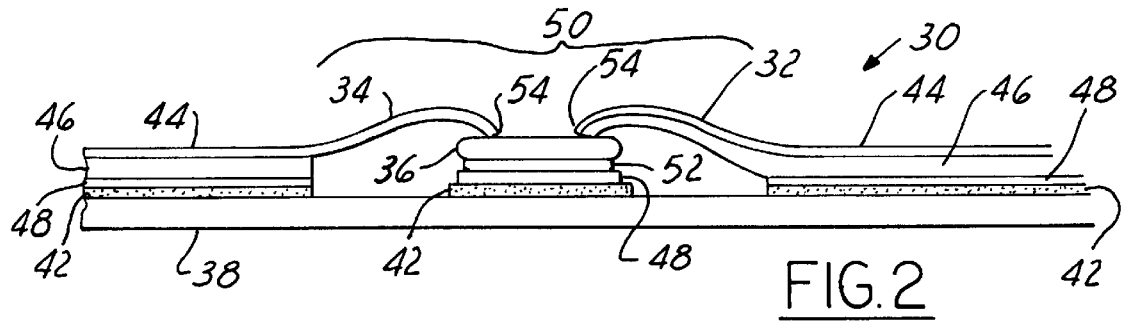
FIG. 2 is an elevation view of a printed circuit board with thin wire and a composite wire attached to a device.
Figure 5:
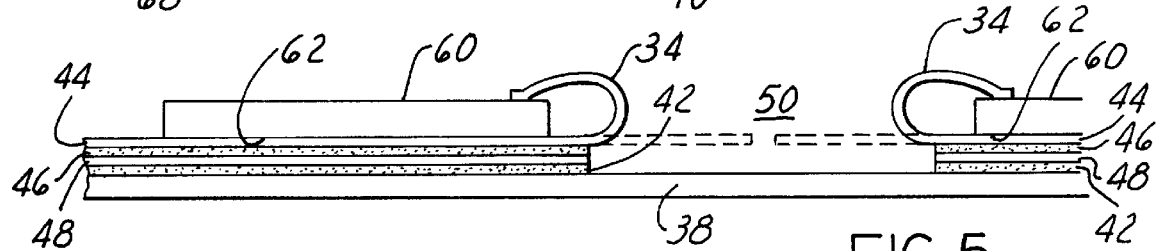
FIG. 5 is an elevation view of an alternate location of the device with the wire trace bonded thereto.

A circuit device or integrated circuit member 36 is then located in the one area or pocket 50. The device 36 is secured to the upper substrate 12 surface as illustrated in FIG. 1; or to the bottom 48 layer as illustrated in FIG. 2; or the top 44 layer of the etched tri-metal material 40 as illustrated in FIG. 5. The device 36 is secured to the surface typically by means of an adhesive material 42. In FIG. 2, an underfill material 52 is located between the device 36 and the bottom 48 layer of the etched tri-metal material 40.

At least one wire trace 34 is created having at least one of the tri-metal layers 44, 46, 48 integral with the top layer 44 that extends from the surface adjacent to the pocket 50. One method of creating the wire trace 34 is by creating a wire shape attached to a pad on the top layer 44 of the tri-metal material 40. Then, according to the practice of the processes in the previously mentioned patents, more particularly the subtractive process, the bottom layer 48 copper is etched away. The tri-metal material 40 is then laminated to the substrate 38 with an adhesive film having a cutout below the proposed wire trace. Next, the aluminum or middle 46 layer is etched from the top side of the tri-metal material 40 to either maintain some aluminum, middle layer 46, on the upper layer 44 resulting in a thicker wire 32 or to etch away all the aluminum layer 46 resulting in a thin wire 34 comprising just the top layer 44. The free end 54 of the wire trace 32, 34 extends over a portion of the device 36 as illustrated in FIG. 2 and bonded to a pad on the device.

Figure 6:
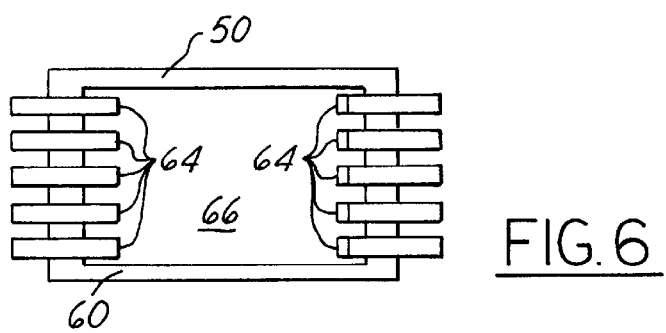
FIG. 6 is a plan view of several wire traces according to FIG. 5.

In an alternative embodiment, as illustrated in FIGS. 5 and 6, the device 60 is mounted on the top layer 44. The wire traces 34 are then formed or bent to extend from the bottom 62 of the device 60 to the bonding pads 64 on the top 66 of the device 60. Typically the device 60 is electrically insulated from the top layer 44 in this embodiment. FIG. 6 is a plan view of several wire traces 34 mounted on the top 66 of the device 60 of FIG. 5.

In another embodiment, the exposed surface is the top of the bottom layer 48 and the device 36 is mounted thereon by means of an adhesive 42. This is further illustrated in FIG. 2.

Figure 3:
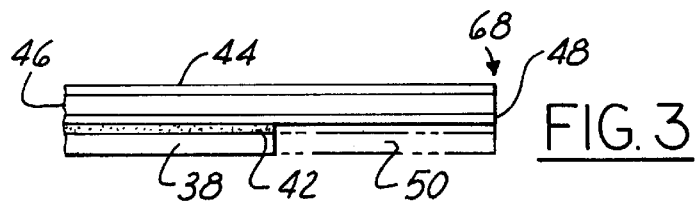
FIG. 3 is an elevation view of a cantilevered wire formed from the tri-metal.
Figure 4:
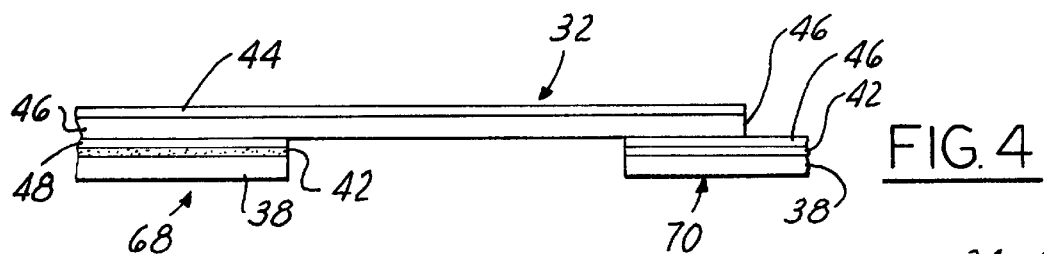
FIG. 4 is an elevation view of a composite cantilevered wire from the tri-metal.

The invention also provides a technique of connecting etched tri-metal layers 40 on different PCBs 68, 70 together. In this embodiment, the pocket 50 is adjacent the edge of the substrate 38. Typically a thicker wire trace 32 is desired, such as one having a composite of both the top layer 44 and a portion of the middle layer 46. The wire trace is longer and extends over the pocket 50 and over the edge of the substrate 38. In this embodiment, as illustrated in FIGS. 3 and 4, when the etched tri-metal layer 40 is secured to the substrate 38, the etched tri-metal layer overhangs the substrate. By means of etching, the bottom 48 or the bottom 48 and middle 46 layers are etched away depending upon the size of wire trace 32, 34 desired. Of course, the upper surface of the wire trace 34 and the upper surface of the etched tri-metal layer 40 are the same. The elongated wire trace from one PCB 68 has a free end 72 that is suitable to bond to a pad on the adjacent PCB 70 as illustrated in FIG. 4. In each embodiment, an immersion silver coating is put on the outside surface of the top layer which enables wire bonding of the copper traces to the cooper pads that have also been coated with immersion silver. In addition to aiding in the bonding, the immersion silver also prevents the copper from oxidizing.

A method for forming an etched tri-metal printed circuit board with integrated wire traces for wire bonding integrated circuit devices to the board has the steps of first locating a substrate layer. Then an etched tri-metal layer, having a top, middle and bottom layer is located and secured. Typically this etched tri-metal layer has a circuit pattern located thereon. The bottom layer is bonded to the substrate layer.

The circuit pattern is etched in one or more layers of the tri-metal layer with the pattern having at least one area adapted to expose the surface of at least the middle layer for forming a pocket in the tri-metal layer. As previously indicated, the depth of the pocket is designer's choice as it can extend to the substrate or any of middle or bottom layers. The circuit device is located in the pocket and is bonded to the bottom surface of the pocket.

Forming at least one wire trace having at least one of the tri-metal layers that is integral with the top layer extending from an adjacent surface to the pocket. A free end of the wire trace extends over a portion of the device. The next step is bonding the wire trace to the device.

In an alternate embodiment, the step of forming the at least one wire trace comprises the step of etching away the middle and bottom layers leaving only the top layer of the tri-metal layers. In another embodiment, the step of forming the at least one wire trace comprises the step of etching away the bottom layer leaving only the top and middle layer of the tri-metal layers.

In still another embodiment the step of etching a circuit pattern forms the pocket adjacent the edge of the substrate. The at least one wire trace is cantileverly extending from a surface adjacent to the pocket with a free end of the wire trace extending over the edge of the substrate.

What is claimed is:

1. An etched tri-metal printed circuit board with integrated wire traces for wire bonding integrated circuit devices to the board comprising:

a substrate layer;

an etched tri-metal layer, having a top, middle and bottom layer, with said bottom layer bonded to said substrate layer;

a circuit pattern etched in one or more layers of said tri-metal layer, said pattern having at least one area adapted to expose the surface of at least said middle layer for forming a pocket in said tri-metal layer;

a circuit device located in said one area and secured to said exposed surface; and at least one wire trace having at least one of said tri-metal layers integral with said top layer extending from an adjacent surface to said pocket with a free end of said wire trace extending over a portion of said device and bonded to said device.

2. An etched tri-metal printed circuit board with integrated wire traces for wire bonding integrated circuit devices to the board according to claim 1 wherein said at least one wire trace comprises only the top layer of the tri-metal layers with the middle and bottom layers being etched away.

3. An etched tri-metal printed circuit board with integrated wire traces for wire bonding integrated circuit devices to the board according to claim 1 wherein said at least one wire trace comprises only the top and middle layer of the tri-metal layers with the bottom layer being etched away.

4. An etched tri-metal printed circuit board with integrated wire traces for wire bonding integrated circuit devices to the board according to claim 1 wherein said circuit device is bonded to said exposed surface by means of an adhesive.

5. An etched tri-metal printed circuit board with integrated wire traces for wire bonding integrated circuit devices to the board according to claim 4 wherein said exposed surface is the bottom layer of said tri-metal and said circuit device is bonded to said exposed bottom layer surface by means of adhesive.

6. An etched tri-metal printed circuit board with integrated wire traces for wire bonding integrated circuit devices to the board according to claim 5 wherein said circuit device is bonded to an underfill material which is bonded to said exposed surface by means of adhesive.

7. An etched tri-metal printed circuit board with integrated wire traces for wire bonding integrated circuit devices to the board according to claim 1 wherein:
   said pocket is adjacent the edge of said substrate; and
   said free end of said wire trace extends over said edge of said substrate.

8. An etched tri-metal printed circuit board with integrated wire traces for wire bonding integrated circuit devices to the board according to claim 7 wherein said at least one wire trace is a cantilever wire trace having the top and middle layers of said tri-metal with said bottom layer removed from said middle layer.

9. An etched tri-metal printed circuit board with integrated wire traces for wire bonding integrated circuit devices to the board according to claim 8 wherein said cantilever wire trace is adapted to be bonded to another device external to said printed circuit board.

10. An etched tri-metal printed circuit board with integrated wire traces for wire bonding integrated circuit devices to the board according to claim 7 wherein said at least one wire trace is a cantilever wire trace comprising the top, middle and bottom layers of said tri-metal.

11. An etched tri-metal printed circuit board with integrated wire traces for wire bonding integrated circuit devices to the board according to claim 10 wherein said cantilever wire trace is adapted to be bonded to another device external to said printed circuit board.

12. An etched tri-metal printed circuit board with integrated wire traces for wire bonding integrated circuit devices to the board comprising:
   a substrate layer;
   an etched tri-metal layer, having a top, middle and bottom layer, with said bottom layer bonded to said substrate layer;
   a circuit pattern etched in one or more layers of said tri-metal layer, said pattern having at least one area adapted to expose the surface of at least said middle layer for forming a pocket in said tri-metal layer;
   a circuit device located on said top layer and adjacent said one area; and
   at least one wire trace having at least one of said tri-metal layers integral with said top layer extending from an adjacent surface to said pocket with a free end of said wire trace extending over a portion of said device and bonded to said device.

13. An etched tri-metal printed circuit board with integrated wire traces for wire bonding integrated circuit devices to the board according to claim 1 additionally including a layer of immersion silver on the surface of the top layer.

14. A method for forming an etched tri-metal printed circuit board with integrated wire traces for wire bonding integrated circuit devices to the board, the method comprises the steps of:
   locating a substrate layer;
   locating an etched tri-metal layer, having a top, middle and bottom layer;
   bonding said bottom layer to said substrate layer;
   etching a circuit pattern in one or more layers of said tri-metal layer, said pattern having at least one area adapted to expose the surface of at least said middle layer for forming a pocket in said tri-metal layer;
   locating a circuit device in the one area;
   bonding said circuit device to the exposed surface;
   forming at least one wire trace having at least one of said tri-metal layers integral with said top layer extending from an adjacent surface to said pocket with a free end of said wire trace extending over a portion of said device; and then
   bonding said wire trace to the device.

15. A method for forming an etched tri-metal printed circuit board with integrated wire traces according to claim 14 wherein the step of forming said at least one wire trace comprises the step of etching away the middle and bottom layers leaving only the top layer of the tri-metal layers.

16. A method for forming an etched tri-metal printed circuit board with integrated wire traces according to claim 14 wherein the step of forming said at least one wire trace comprises the step of etching away the bottom layer leaving only the top and middle layer of the tri-metal layers.

17. A method for forming an etched tri-metal printed circuit board with integrated wire traces according to claim 14 wherein the step of bonding the circuit device to the exposed surface is by means of an adhesive.

18. A method for forming an etched tri-metal printed circuit board with integrated wire traces according to claim 14 wherein the step of etching a circuit pattern forms the pocket adjacent the edge of said substrate;
   forming at least one wire trace having at least one of said tri-metal layers integral with said layer; and then
   cantileverly extending said at least one wire trace from a surface adjacent to said pocket with a free end of said wire trace extending over said edge of said substrate.

* * * * *